United States Patent
Nakata et al.

[11] Patent Number: 5,989,928
[45] Date of Patent: Nov. 23, 1999

[54] METHOD AND DEVICE FOR DETECTING END POINT OF PLASMA TREATMENT, METHOD AND DEVICE FOR MANUFACTURING SEMICONDUCTOR DEVICE, AND SEMICONDUCTOR DEVICE

[75] Inventors: Toshihiko Nakata; Takanori Ninomiya, both of Hiratsuka, Japan

[73] Assignee: Hitachi, Ltd., Tokyo, Japan

[21] Appl. No.: 09/051,767

[22] PCT Filed: Oct. 21, 1996

[86] PCT No.: PCT/JP96/03042

§ 371 Date: Apr. 20, 1998

§ 102(e) Date: Apr. 20, 1998

[87] PCT Pub. No.: WO97/15074

PCT Pub. Date: Apr. 24, 1997

[30] Foreign Application Priority Data

Oct. 20, 1995 [JP] Japan ................................. 7-272318

[51] Int. Cl.[6] ............................................. H01L 21/00
[52] U.S. Cl. ..................... 438/7; 438/8; 438/9; 156/345
[58] Field of Search .................... 438/7, 8, 9; 156/345

[56] References Cited

U.S. PATENT DOCUMENTS

| | | | |
|---|---|---|---|
| 4,263,089 | 4/1981 | Keller | 156/627 |
| 4,377,436 | 3/1983 | Donelly et al. | 156/626 |
| 4,430,151 | 2/1984 | Tsukada | 156/626 |
| 4,457,820 | 7/1984 | Bergeron et al. | 204/192 |
| 4,493,745 | 1/1985 | Chen et al. | 156/626 |
| 5,045,149 | 9/1991 | Nulty | 156/627 |
| 5,308,414 | 5/1994 | O'Neill et al. | |
| 5,320,704 | 6/1994 | Horioka et al. | 156/626 |
| 5,739,051 | 4/1998 | Saito | 438/16 |

FOREIGN PATENT DOCUMENTS

| | | |
|---|---|---|
| 57-120674 | 7/1982 | Japan . |
| 6-28252 | 4/1994 | Japan . |
| 6-229827 | 8/1994 | Japan . |

*Primary Examiner*—William Powell
*Assistant Examiner*—Vanessa Perez-Ramos
*Attorney, Agent, or Firm*—Antonelli, Terry, Stout & Kraus, LLP

[57] ABSTRACT

In order to detect the end point of a plasma process stably and at a high precision always without being affected by the fine delineation of a pattern to be processed and an external disturbance, it is constructed such that emission wavelength components 27 of species are taken out of a plasma emission 24 and only a frequency component synchronous with a high-frequency electric power for plasma excitation is extracted by a synchronous detection circuit 30 and so on. Thereby, the progressing status of etching is seized more accurately and a change in signal at an end point becomes clear. As a result, the precision of detection of the end point of a plasma process for a minute aperture pattern is improved.

17 Claims, 10 Drawing Sheets

METHOD AND DEVICE FOR DETECTING END POINT OF PLASMA TREATMENT, METHOD AND DEVICE FOR MANUFACTURING SEMICONDUCTOR DEVICE, AND SEMICONDUCTOR DEVICE

TECHNICAL FIELD

The present invention relates to a plasma process end point detecting method and apparatus, a semiconductor device manufacturing method and apparatus, and a semiconductor device manufactured using the manufacturing method.

BACKGROUND ART

A process using a plasma is widely applied to an etching device as well as a semiconductor manufacturing process and a liquid crystal display device substrate manufacturing process.

The prior art will be described in conjunction with a plasma etching device, shown in FIG. 16, which is taken as an example. In this etching device, a high voltage from a high-frequency power supply 5 is applied between an upper electrode 2 and a lower electrode 3 arranged in a processing chamber 1 and in parallel to each other to generate a plasma 6 from an etching gas by virtue of discharge between both the electrodes so that a semiconductor wafer 4 as an object to be processed is etched by species in the plasma. In performing an etching process, the progressing status of etching is monitored to detect an end point of the etching process as correctly as possible, thereby performing the etching process by only a predetermined pattern configuration and depth.

Techniques including spectral analysis, mass spectrometry and so on have hitherto been used in a method for detecting the end point of etching. Especially, the spectral analysis having a simple device construction and a high sensitivity is widely used, as shown by JP-B-6-28252. More particularly, a specified one of species including radicals or ions such as an etching gas and a decomposition product or reaction product thereof is selected and the emission intensity of an emission spectrum from the selected species is measured. Namely, in FIG. 16, an emission 8 from the plasma is passed through a window 7 so that it is subjected to spectroscopic analysis by a spectroscope 9 such as a monochrometer to extract only an emission component 10 having a predetermined wavelength. This emission component 10 is received by a photoelectric conversion element 11 such as a photomultiplier for conversion into an electric signal and is amplified by an amplifier 12. Thereafter, the amplified component is sent to an end point judging unit 13. In the end point judging unit 13, a temporal change 15 in emission intensity is observed, as shown in FIG. 17, so that the emission intensity at a changing point or the value of first-order differentiation or second-order differentiation thereof is compared with a preset threshold S to determine the end point position E of etching. When the end point is detected, the output of the high-frequency power supply 5 is stopped by a power supply controller 14.

The species to be selected differs depending upon the kind of an etching gas. For example, in the case where a silicon oxide film is etched by use of an etching gas of a fluorocarbon series such as $CF_4$, an emission spectrum (e.g. 219 nm or 483.5 nm) from its reaction product CO* or an emission spectrum (e.g. 260 nm) from its intermediate product CF* is measured.

With the above-mentioned prior art, the end point of etching can be determined with a simple construction. However, the total area of portions subjected to etching becomes small with the fine delineation of a circuit pattern of a semiconductor device so that the absolute amount of a reaction product is reduced. There results in such a temporal change in emission intensity as shown by one-dotted chain line 16 in FIG. 17. Namely, not only the emission intensity itself is reduced but also the amount of change in emission intensity at the end point position is greatly reduced and a very obtuse waveform is exhibited, which makes the judgement of an end point position difficult. This is a large problem in the prior art.

On the other hand, a high-frequency electric power for plasma excitation is on the order of several-hundred kHz and it is considered that an etching reaction and an emission from a reaction product are synchronous with this frequency. In the prior art, however, the amplifier 12 used for the amplification of an emission signal has a band on the order of about 100 Hz to several kHz so that a DC component is mainly detected by smoothing a periodic emission from a reaction product. Therefore, the prior art has a problem that it does not accurately seize the etching reaction and it is susceptible to the influence of gentle variations in plasma emission or the influence of unnecessary frequency components.

An object of the present invention is to provide a plasma process end point detecting method and apparatus and a semiconductor device manufacturing method and apparatus in which the end point of a plasma process can be detected stably and at a high precision always without being affected by the fine delineation of a pattern to be processed and an external disturbance and to provide a semiconductor device which is manufactured using such a manufacturing method.

DISCLOSURE OF THE INVENTION

To attain the above object, in the present invention, when an object to be processed is subjected to a process using a plasma, the emission intensity of species producing an emission therefrom at a specified wavelength in the plasma is detected and an end point of the plasma process is detected from a change in amplitude of periodic temporal variations of the emission intensity.

To attain the above object, in the present invention, the frequency of the periodic temporal variations of the emission intensity may be integer times as high as the frequency of a high-frequency power supply for plasma excitation.

To attain the above object, in the present invention, the species may include a reaction product generated by the plasma process.

To attain the above object, in the present invention, the species may include a reactive gas used in the plasma process or a decomposition product.

To attain the above object, in the present invention, the specified wavelength may be approximately 219 nm.

To attain the above object, in the present invention, the specified wavelength may be approximately 260 nm.

To attain the above object, in the present invention, the emission intensity of said species may be detected by an imaging optical system provided with a photo detector which has an imaging relation with the plasma.

To attain the above object, the present invention has, as constituent elements of an apparatus, emission detecting means for detecting the emission intensity of species which produces an emission therefrom at a specified wavelength in the plasma, amplitude detecting means for detecting the amplitude of periodic temporal variations of the detected emission intensity signal, and end point judging means for detecting an end point of the process from a change in the amplitude.

To attain the above object, the present invention may use the above-mentioned plasma process end point detecting means when a semiconductor substrate is subjected to a process using a plasma.

To attain the above object, the present invention may use the above-mentioned plasma process end point detecting means when a semiconductor device is manufactured by subjecting a semiconductor substrate to a process using a plasma.

With the construction in which when an object to be processed is subjected to a process using a plasma, the emission intensity of species producing an emission therefrom at a specified wavelength in the plasma is detected and a component having periodical temporal variations is extracted from the emission intensity, it becomes possible to seize the progress of the plasma process accurately. Further, with the construction in which an end point of the plasma process is detected from a change in amplitude of the component having the periodic temporal variations, it becomes possible to detect the end point of the plasma process at a high precision as compared with the conventional method.

With the construction in which the frequency of the periodic temporal variations of the emission intensity is integer times as high as the frequency of a high-frequency power supply for plasma excitation, it becomes possible to seize the progress of the plasma process accurately. Further, with the construction in which an end point of the plasma process is detected from a change in amplitude of the component having the periodic temporal variations, it becomes possible to detect the end point of the plasma process at a high precision as compared with the conventional method.

With the construction in which the species includes a reaction product generated by the plasma process, it becomes possible to seize the progress of the plasma process accurately. Further, with the construction in which an end point of the plasma process is detected from a change in amplitude of the component having the periodic temporal variations, it becomes possible to detect the end point of the plasma process at a high precision as compared with the conventional method.

With the construction in which the species includes a reactive gas used in the plasma process or a decomposition product, it becomes possible to seize the progress of the plasma process accurately. Further, with the construction in which an end point of the plasma process is detected from a change in amplitude of the component having the periodic temporal variations, it becomes possible to detect the end point of the plasma process at a high precision as compared with the conventional method.

With the construction in which the specified wavelength is approximately 219 nm, it becomes possible to seize the progress of the plasma process accurately. Further, with the construction in which an end point of the plasma process is detected from a change in amplitude of the component having the periodic temporal variations, it becomes possible to detect the end point of the plasma process at a high precision as compared with the conventional method.

With the construction in which the specified wavelength is approximately 260 nm, it becomes possible to seize the progress of the plasma process accurately. Further, with the construction in which an end point of the plasma process is detected from a change in amplitude of the component having the periodic temporal variations, it becomes possible to detect the end point of the plasma process at a high precision as compared with the conventional method.

With the construction in which the emission intensity of said species is detected by an imaging optical system provided with a photo detector which has an imaging relation with the plasma, it becomes possible to seize the progress of the plasma process accurately. Further, with the construction in which an end point of the plasma process is detected from a change in amplitude of the component having the periodic temporal variations, it becomes possible to detect the end point of the plasma process at a high precision as compared with the conventional method.

With the construction in which the above-mentioned plasma process end point detecting means is used when a semiconductor substrate is subjected to a process using a plasma, it becomes possible to manufacture a semiconductor device having a high quality.

BEST MODE FOR CARRYING OUT THE INVENTION

For more detailed description of the present invention, the present invention will be described in accordance with the accompanying drawings.

Figure 1:
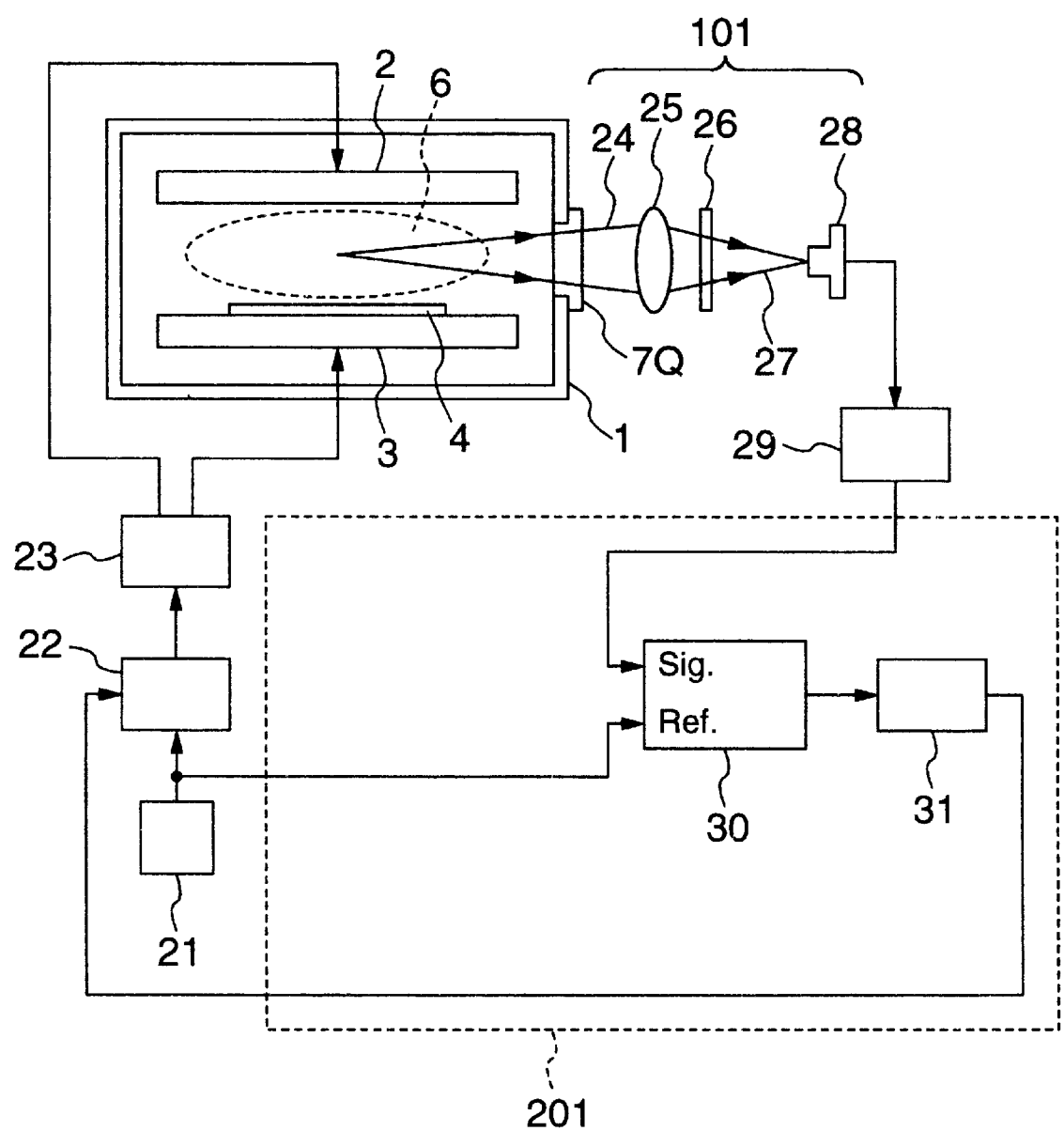
FIG. 1 is a diagram showing an etching end point detecting apparatus in a first embodiment of the present invention.

First, a first embodiment of the present invention will be described on the basis of FIGS. 1 to 5. FIG. 1 shows an etching end point detecting apparatus in the first embodiment. This apparatus includes an emission detecting optical system 101 and a signal processing and judging system 201.

An etching device used in the present embodiment is a parallel plate type plasma etching device. An output voltage of a power amplifier 22 is modulated by a high-frequency signal from a signal generator 21 and this high-frequency voltage is distributed by a distributor 23. The distributed voltage is applied between an upper electrode 2 and a lower electrode 3 arranged in a processing chamber 1 and in parallel to each other to generate a plasma 6 from an etching gas by virtue of discharge between both the electrodes so that a semiconductor wafer 4 as an object to be processed is etched by species of the plasma. The frequency of the used high-frequency signal is, for example, about 400 kHz.

In the emission detecting optical system 101, the emission 24 from the plasma is passed through a quartz window 7Q and is imaged by a quartz lens 25 onto a photoelectric conversion element 28 such as a photodiode. A certain point in a plasma emission area above the wafer 4 and the photoelectric conversion element 28 have an imaging relation. An interference filter 26 is disposed in an optical path to permit the selective transmission of only an emission spectrum component 27 from a specified species. Taking as an example the case where a silicon oxide film is etched by use of an etching gas of a fluorocarbon series such as $CF_4$, an interference filter having a transmission center wavelength of 219 nm or 483.5 nm is disposed in the case where an emission spectrum from a reaction product CO* is to be extracted whereas an interference filter having a transmission center wavelength of 260 nm is disposed in the case where an emission spectrum from an intermediate product CF* is to be extracted. Of course, a monochrometer can be used in lieu of the interference filter. Since the construction of the emission detecting optical system 101 as an imaging optical system enables the detection of an emission component from a limited region on the wafer, it is possible to reduce the obtuseness of an end point detection signal caused from in-plane variations of the thickness of a film to be processed or in-plane variations of an etching rate. The photoelectrically converted emission signal is amplified by an amplifier 29 having a band on the order of 4 MHz which is sufficiently large as compared with the high-frequency electric power for plasma excitation.

Figure 2:
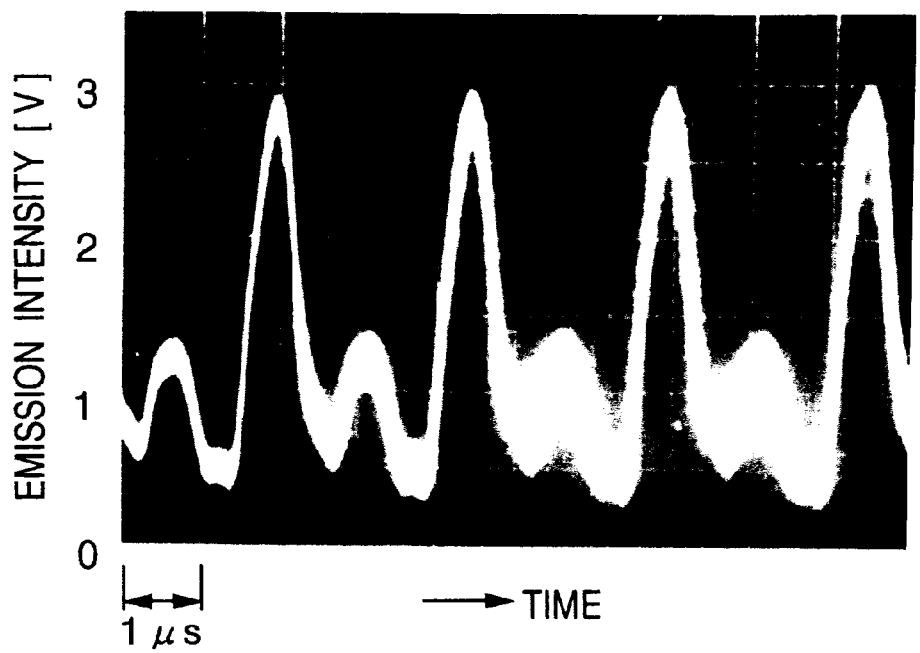
FIG. 2 is a diagram showing the emission waveform of a plasma in a state in which all wavelengths are involved.

FIG. 2 shows an emission waveform after amplification. This waveform is not an emission waveform resulting from the selection of a specified wavelength but an emission waveform in a state in which all wavelengths are involved. It is found that a change in emission intensity is repeated in a form in which an emission process accompanying the excitation and attenuation of various species in the plasma is superimposed on the fundamental period of 400 kHz synchronous with the high-frequency electric power for plasma excitation.

Figure 3:
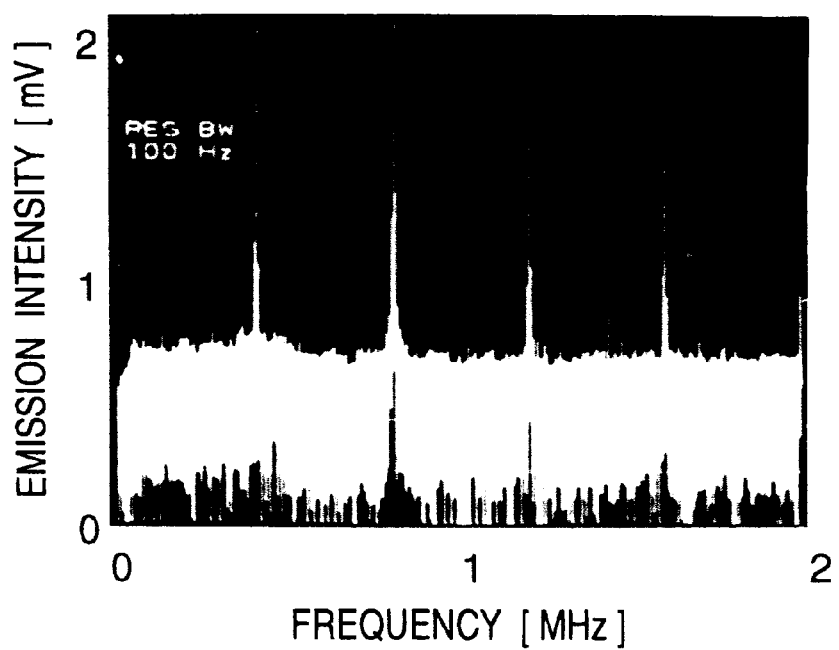
FIG. 3 is a diagram showing the frequency spectrum of the plasma emission.

The existence of the repetition of a 180° phase shifted low peak relative to the repetition of a high peak having the 400 kHz period originates from the shift of just 180° between the timings of application of high-frequency voltages to the upper and lower electrodes. FIG. 3 shows an example of observation of the frequency spectrum of the emission waveform by a spectral analyzer. The spectra of 400 kHz and integer times as high as 400 kHz are observed.

Figure 4:
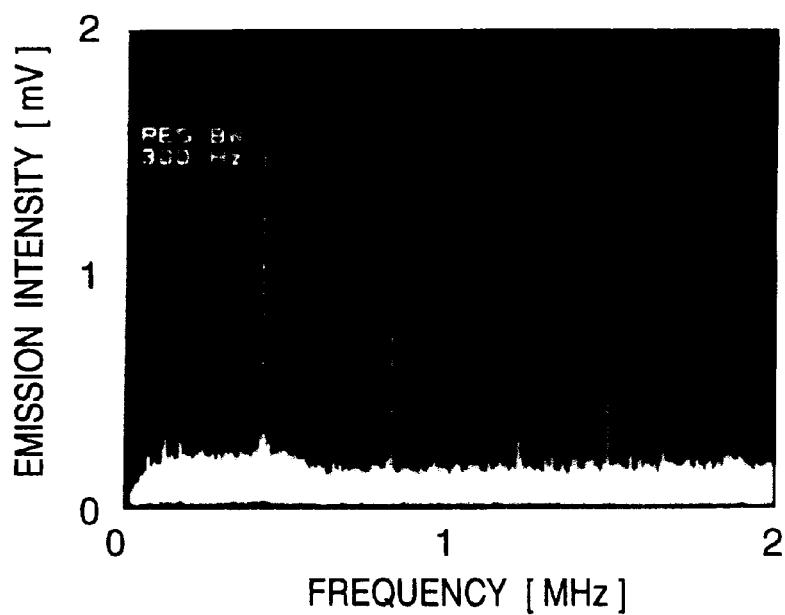
FIG. 4 is a diagram showing the frequency spectrum of an emission wavelength component from a reaction product $CO^*$.

FIG. 4 shows the result of observation of a frequency spectrum in the case where an interference filter having a transmission center frequency of 219 nm is disposed in the optical path to detect the emission spectrum waveform component from CO*. The spectra of 400 kHz, 800 kHz and 1200 kHz components are observed.

Figure 5:
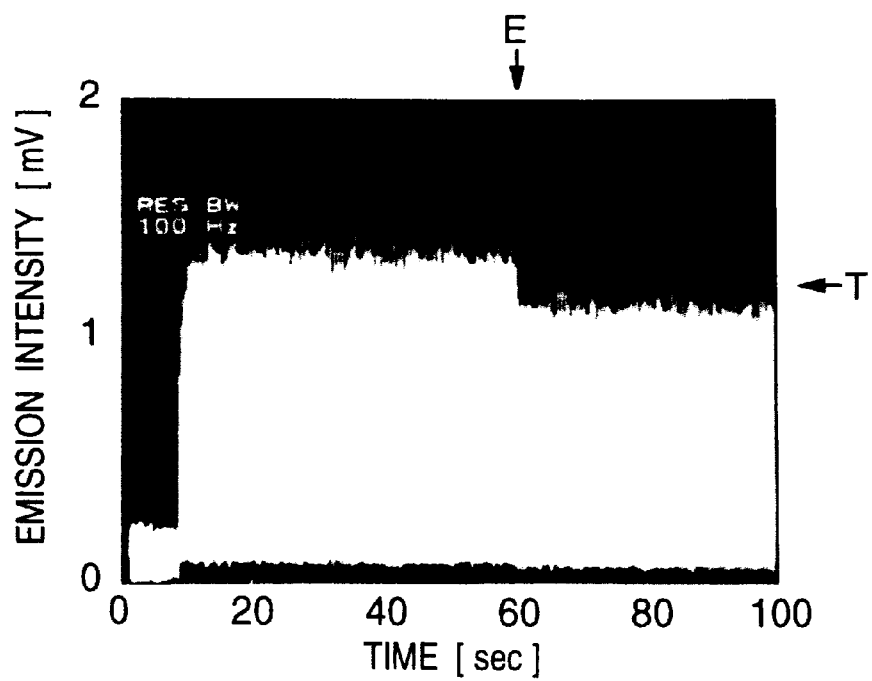
FIG. 5 is a diagram showing the temporal change of an emission intensity signal of wavelength 219 nm (or the emission wavelength component from the reaction product $CO^*$) and frequency 400 kHz.

An output signal from the amplifier 29 is sent to the signal processing and judging system 201. In the signal processing and judging system 201, a synchronous detection circuit 30 such as a lock-in amplifier selectively extracts only the 400 kHz component from the frequency spectrum observed in FIG. 4 with the high-frequency signal of frequency 400 kHz from the signal generator 21 being taken as a reference signal. FIG. 5 shows a temporal change of the extracted emission intensity signal of wavelength 219 nm and frequency 400 kHz. The emission intensity is abruptly lowered in the vicinity of 60 s after the start of measurement. This portion corresponds to the end point position of etching. This emission intensity signal is sent to an end point judging circuit 31 in which the emission intensity at a changing point or the value of first-order differentiation or second-order differentiation thereof is compared with a preset threshold, thereby accurately determining the end point position of etching. For example, a point of time E when the emission intensity becomes below the preset threshold T is judged as being the end point, as shown in FIG. 5. The threshold T is set in accordance with the device conditions including a high-frequency electric power, a pressure and so on and the process conditions including the thickness and material of a film to be processed, an etching gas and so on. When the end point is detected, the output of the power amplifier 22 is stopped on the basis of a control signal.

It is considered that an etching reaction and the emission from a reaction product are synchronous with the high-frequency electric power for plasma excitation. Accordingly, with the construction in which only a frequency component synchronous with the high-frequency electric power is extracted from among emission wavelength components of the reaction product, as shown by the present embodiment, the progressing status of etching can be seized more accurately and a change in signal at an end point becomes clear, thereby improving the precision of detection of an etching end point for a minute aperture pattern.

In the present embodiment, since only the frequency component synchronous with the high-frequency electric power is extracted from among the emission wavelength components of the reaction product, the unsusceptibility to the influence of gentle variations in plasma emission or the influence of unnecessary frequency components is obtained, thereby improving the SN ratio of an emission intensity signal.

Also, it has already been mentioned that since the construction of the emission detecting optical system 101 as an imaging optical system enables the detection of an emission component from a limited region on a wafer, it is possible to reduce the obtuseness of an end point detecting signal caused from in-plane variations of the thickness of a film to be processed or in-plane variations of an etching rate.

Figure 6:
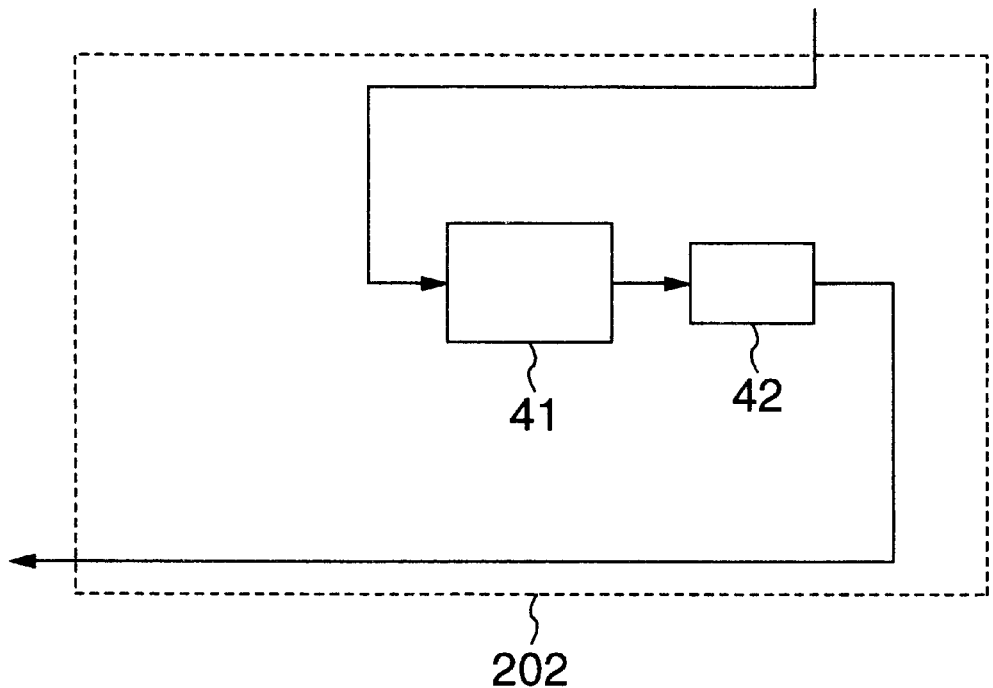
FIG. 6 is a diagram showing a signal processing and judging system in a second embodiment of the present invention.

A second embodiment of the present invention will be described on the basis of FIG. 6. Since the construction and function of an etching device and an emission detecting optical system in the present embodiment are similar to those in the first embodiment, the description thereof will be omitted.

In the present embodiment, a spectrum analyzer 41 is used in a signal processing and judging system 202 to extract a 400 kHz component synchronous with the high-frequency electric power. By setting the central frequency of the spectrum analyzer 41 to 400 kHz and the frequency span to 0 Hz, an emission intensity signal with the 400 kHz component similar to that shown in FIG. 5 can be extracted from the output signal of the amplifier 29. This emission intensity signal is sent to an end point judging circuit 42 in which in a manner similar to that in the first embodiment, the emission intensity at a changing point or the value of first-order differentiation or second-order differentiation thereof is compared with a preset threshold to determine the end point position of etching. When the end point is detected, the output of the power amplifier 22 is stopped on the basis of a control signal.

According to the present embodiment, with the construction in which only a frequency component synchronous with the high-frequency electric power for plasma excitation is extracted from among emission wavelength components of a reaction product, as in the first embodiment, the progressing status of etching can be seized more accurately and a change in signal at an end point becomes clear, thereby improving the precision of detection of an etching end point for a minute aperture pattern.

Similarly, since only the frequency component synchronous with the high-frequency electric power is extracted from among the emission wavelength components of the reaction product, the unsusceptibility to the influence of gentle variations in plasma emission or the influence of unnecessary frequency components is obtained, thereby improving the SN ratio of an emission intensity signal.

Also, since no reference signal is required, the present embodiment has an effect that the apparatus construction is simplified.

Figure 7:
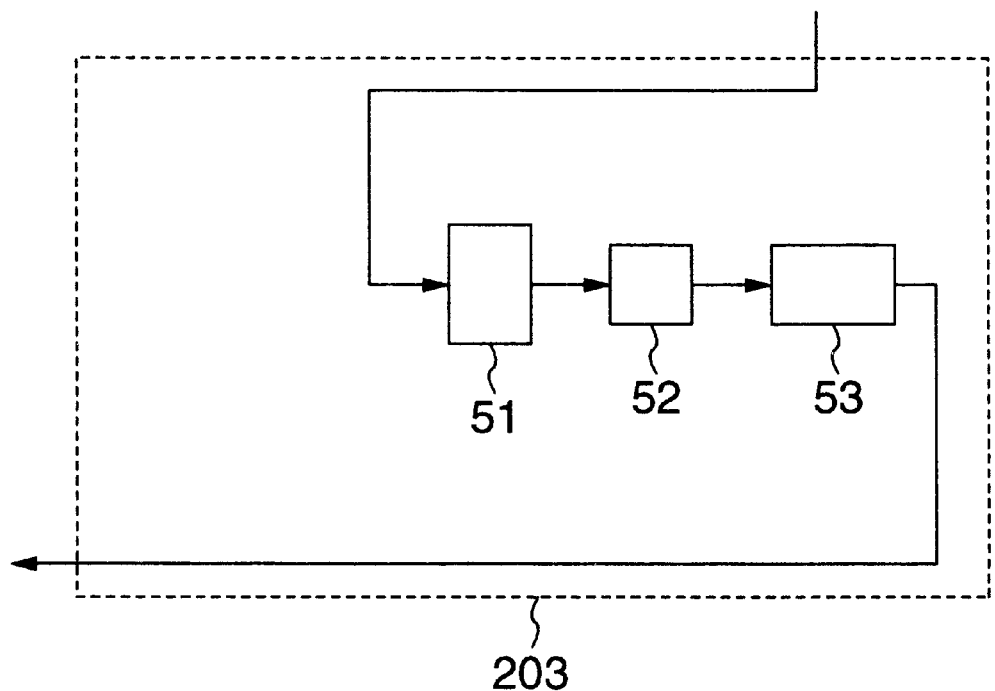
FIG. 7 is a diagram showing a signal processing and judging system in a third embodiment of the present invention.

A third embodiment of the present invention will be described on the basis of FIG. 7. Since the construction and function of an etching device and an emission detecting optical system in the present embodiment are similar to those in the first embodiment, the description thereof will be omitted.

In the present embodiment, a band pass filter 51 having a transmission center frequency of 400 kHz is used in a signal processing and judging system 203 to extract a 400 kHz component synchronous with the high-frequency electric power. A signal similar to the emission intensity signal shown in FIG. 5 is obtained from the band pass filter 51. This emission intensity signal is passed through a low pass filter 52 of about 100 Hz substantially equal to the sampling frequency of the signal and is thereafter sent to an end point judging circuit 53 in which in a manner similar to that in the first embodiment, the emission intensity at a changing point or the value of first-order differentiation or second-order differentiation thereof is compared with a preset threshold to determine the end point position of etching. When the end point is detected, the output of the power amplifier 22 is stopped on the basis of a control signal.

According to the present embodiment, with the construction in which only a frequency component synchronous with the high-frequency electric power for plasma excitation is extracted from among emission wavelength components of a reaction product, as in the first embodiment, the progressing status of etching can be seized more accurately and a change in signal at an end point becomes clear, thereby improving the precision of detection of an etching end point for a minute aperture pattern.

Similarly, since only the frequency component synchronous with the high-frequency electric power is extracted from among the emission wavelength components of the reaction product, the unsusceptibility to the influence of gentle variations in plasma emission or the influence of unnecessary frequency components is obtained, thereby improving the SN ratio of an emission intensity signal.

Also, since no reference signal is required as in the second embodiment, the apparatus construction is simplified.

Figure 8:
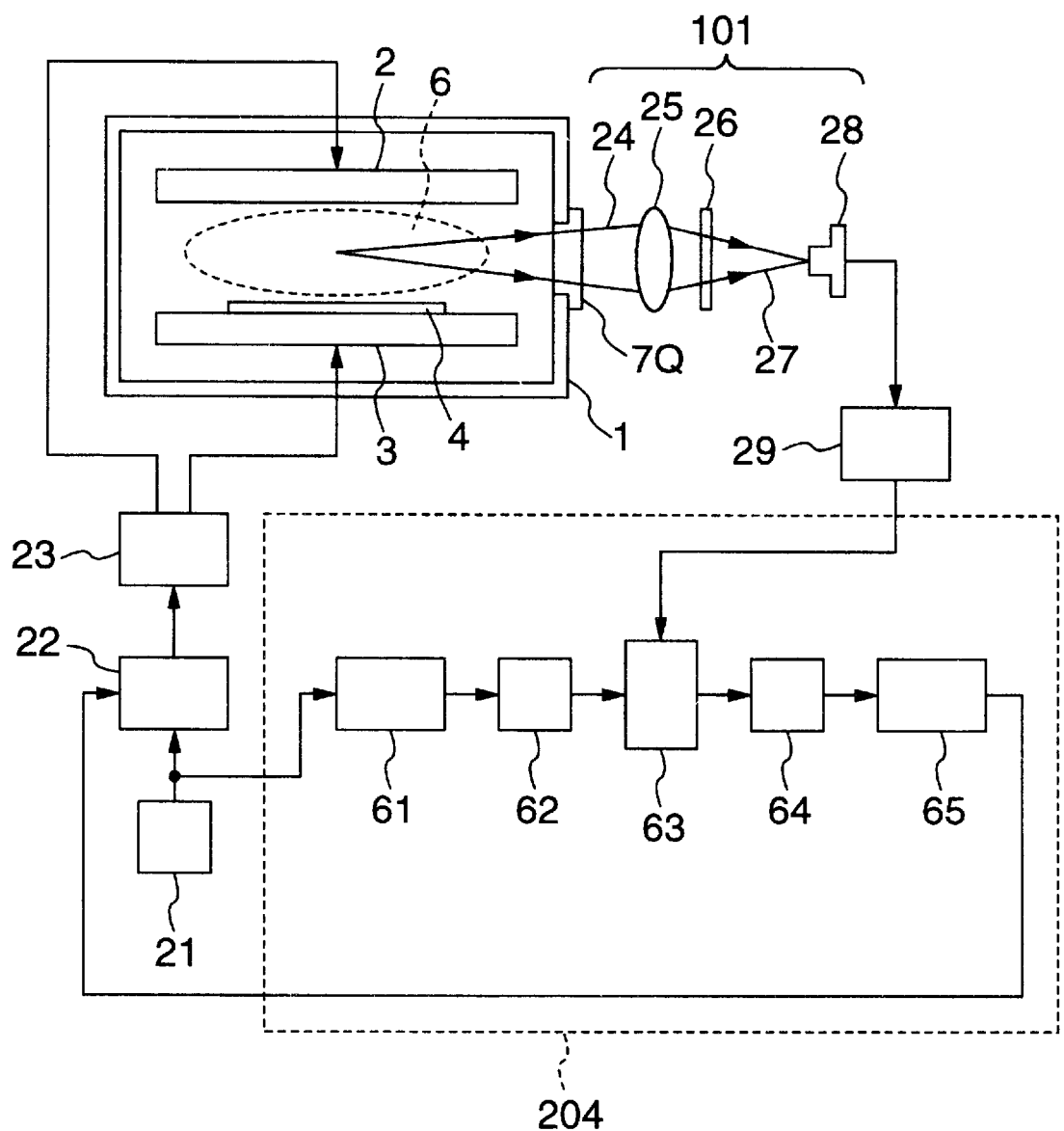
FIG. 8 is a diagram showing an etching end point detecting apparatus in a fourth embodiment of the present invention.
Figure 9:
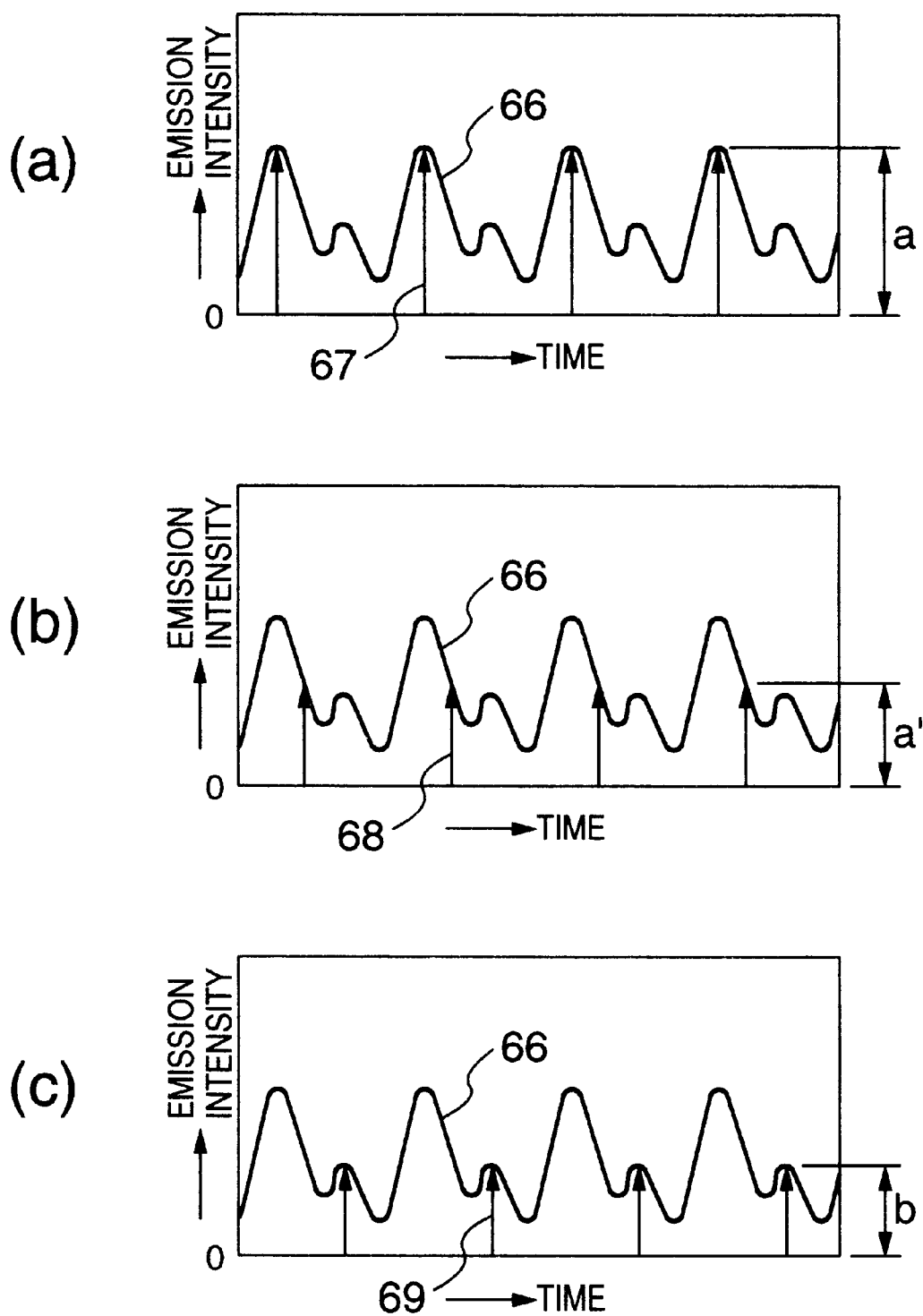
FIG. 9 is diagrams showing the emission waveform from a reaction product $CO^*$ and the timing of sampling.

A fourth embodiment of the present invention will be described on the basis of FIGS. 8 and 9. Since the construction and function of an etching device and an emission detecting optical system 101 in FIG. 8 are similar to those in the first embodiment, the description thereof will be omitted.

In the present embodiment, a sample and hold circuit 63 is used in a signal processing and judging system 204 to extract a 400 kHz component synchronous with the high-frequency electric power. First, a sampling signal including an impulse train 67 (or comb function) with the frequency of 400 kHz as shown in FIG. 9(a) is generated by a sampling signal generating circuit 61 on the basis of a high-frequency signal from the signal generator 21. In FIG. 9(a), a waveform 66 is the emission waveform from a reaction product $CO^*$ detected by the photoelectric conversion element 28 through an interference filter having a transmission center frequency of 219 nm. The sampling signal is phase-shifted through a phase shifter 62 by a desired amount in accordance with the emission waveform and is there after sent to the sample and hold circuit 63 which in turn samples and holds the emission waveform of the reaction product $CO^*$ and outputs an amplitude a, as shown in FIG. 9(a). In FIG. 9(a), a higher peak having the period of 400 kHz is caught. However, it is also possible to catch a waveform at a timing with slight attenuation from the higher peak (or an amplitude a') by adjusting the amount of phase shift, as shown in FIG. 9(b) or to catch a lower peak having the period of 400 kHz (or an amplitude b), as shown in FIG. 9(c). In any case, it is preferable that the amount of phase shift is set such that the emission waveform is sampled at a timing with which an etching reaction is reflected most strongly.

An output signal from the sample and hold circuit 63 is sent to a low pass filter 64 of about 100 Hz to obtain an emission intensity signal similar to that shown in FIG. 5. This emission intensity signal is sent to an end point judging circuit 65 in which in a manner similar to that in the first embodiment, the emission intensity at a changing point or the value of first-order differentiation or second-order differentiation thereof is compared with a preset threshold to determine the end point position of etching. When the end point is detected, the output of the power amplifier 22 is stopped on the basis of a control signal.

According to the present embodiment, with the construction in which only a frequency component synchronous with the high-frequency electric power for plasma excitation is extracted from among emission wavelength components of a reaction product, as in the first embodiment, the progressing status of etching can be seized more accurately and a change in signal at an end point becomes clear, thereby improving the precision of detection of an etching end point for a minute aperture pattern.

Similarly, since only the frequency component synchronous with the high-frequency electric power is extracted from among the emission wavelength components of the reaction product, the unsusceptibility to the influence of gentle variations in plasma emission or the influence of unnecessary frequency components is obtained, thereby improving the SN ratio of an emission intensity signal.

Also, according to the present embodiment, since the timing of sampling of an emission waveform can be adjusted arbitrarily, it becomes possible to obtain emission information in which an etching reaction is reflected more strongly, thereby improving the precision of end point detection.

Figure 10:
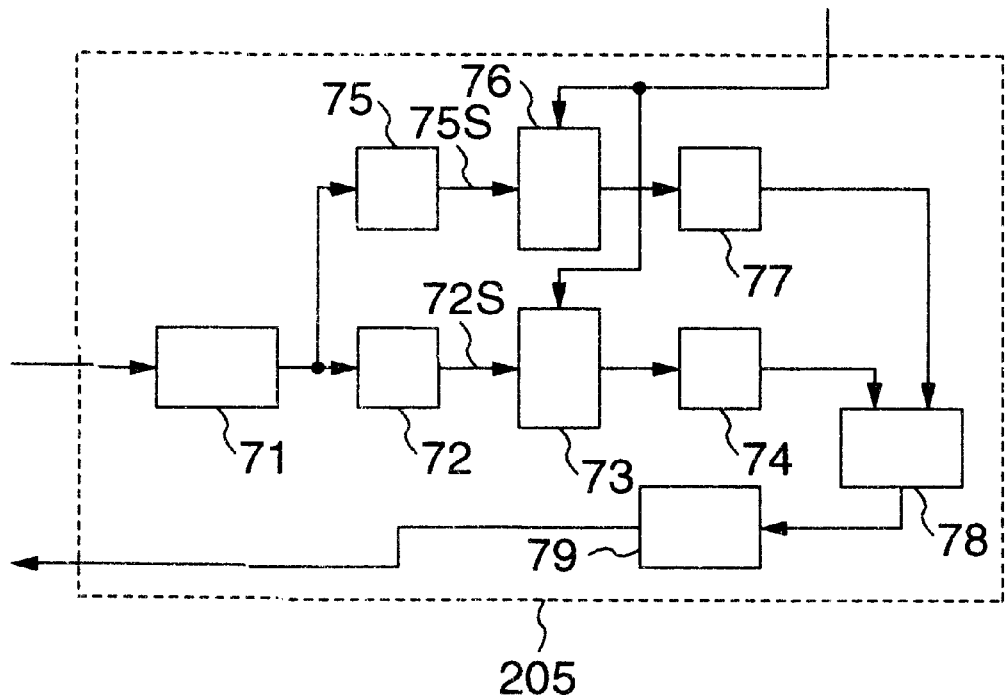
FIG. 10 is a diagram showing a signal processing and judging system in a fifth embodiment of the present invention.
Figure 11:
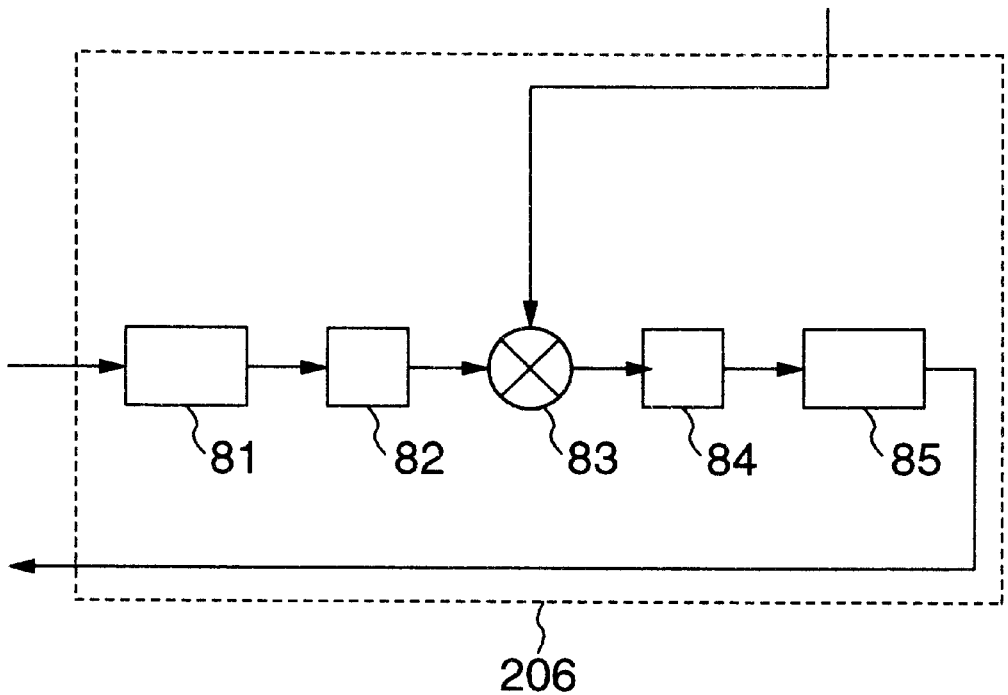
FIG. 11 is a diagram showing a signal processing and judging system in a sixth embodiment of the present invention.

A fifth embodiment of the present invention will be described on the basis of FIGS. 9 and 10. Since the construction and function of an etching device and an emission detecting optical system in the present embodiment are similar to those in the first embodiment, the description thereof will be omitted.

In the present embodiment, an etching reaction is determined more accurately in a signal processing and judging system 205 by dividing an emission signal into two portions, sampling these signals at two kinds of different timings having the same frequency but shifted in phase, and producing a difference between two obtained detection signals or the intensity ratio of one thereof to the other.

First, a sampling signal including an impulse train 67 (or comb function) with the frequency of 400 kHz as shown in FIG. 9(a) is generated by a sampling signal generating circuit 71 on the basis of a high-frequency signal from the signal generator 21. In FIG. 9(a), a waveform 66 is the emission waveform of a reaction product CO* detected by the photoelectric conversion element 28 through an interference filter having a transmission center frequency of 219 nm. The sampling signal is divided into two portions which are respectively sent to phase shifters 72 and 75 so that different amounts of shift are given. Thereafter, the sampling signals 72S and 75S are sent to sample and hold circuits 73 and 76, respectively. An emission signal of the reaction product outputted from the amplifier 29 is divided into two portions which are respectively inputted to the sample and hold circuits 73 and 76. The phase shifters 72 and 75 are adjusted such that the timing of sampling by the sampling signal 72S catches a higher peak of the emission waveform (or an amplitude a) as shown in FIG. 9(a) and the timing of sampling by the sampling signal 75S catches a lower peak (or an amplitude b) as shown in FIG. 9(c). The signals with amplitudes a and b detected by the sample and hold circuits 73 and 76 are passed through low pass filters 74 and 77 of about 100 Hz to obtain emission intensity signals similar to that shown in FIG. 5. Both the emission intensity signals are sent to an operation processing circuit 78. The operation processing circuit 78 determines a difference between the amplitude a and the amplitude b or the ratio of one thereof to the other and outputs it. With this operation processing, it becomes possible to reduce the influence of unnecessary emission components which are generated due to a difference between the timings of application to the upper and lower electrodes and have a low relation with an etching reaction just above the wafer.

An output signal from the operation processing circuit 78 is sent to an end point judging circuit 79 in which in a manner similar to that in the first embodiment, the emission intensity at a changing point or the value of first-order differentiation or second-order differentiation thereof is compared with a preset threshold to determine the end point position of etching. When the end point is detected, the output of the power amplifier 22 is stopped on the basis of a control signal.

According to the present embodiment, with the construction in which only a frequency component synchronous with the high-frequency electric power for plasma excitation is extracted from among emission wavelength components of a reaction product, as in the first embodiment, the progressing status of etching can be seized more accurately and a change in signal at an end point becomes clear, thereby improving the precision of detection of an etching end point for a minute aperture pattern.

Similarly, since only the frequency component synchronous with the high-frequency electric power is extracted from among the emission wavelength components of the reaction product, the unsusceptibility to the influence of gentle variations in plasma emission or the influence of unnecessary frequency components is obtained, thereby improving the SN ratio of an emission intensity signal.

Also, according to the present embodiment, since the timing of sampling of an emission waveform can be adjusted arbitrarily, it becomes possible to obtain emission information in which an etching reaction is reflected more strongly, thereby improving the precision of end point detection.

Further, according to the present embodiment, since it becomes possible to reduce the influence of emission components which are generated due to a difference between the timings of application to the upper and lower electrodes and have a low relation with an etching reaction just above the wafer, the precision of end point detection is improved.

A sixth embodiment of the present invention will be described on the basis of FIGS. 11 to 14. Since the construction and function of an etching device and an emission detecting optical system in the present embodiment are similar to those in the first embodiment, the description thereof will be omitted.

The fourth embodiment has been described in conjunction with the method in which a 400 kHz component synchronous with the high-frequency electric power is extracted by the sample and hold circuit 63 using the sampling signal including the impulse train 67 (or comb function) with the frequency of 400 kHz. In the present embodiment, however, the 400 kHz component synchronous with the high-frequency electric power is extracted through not the sampling by the impulse train 67 (or comb function) but the multiplication of an emission signal by a pulse train (or rectangular wave function) having a certain fixed width.

Figure 12:
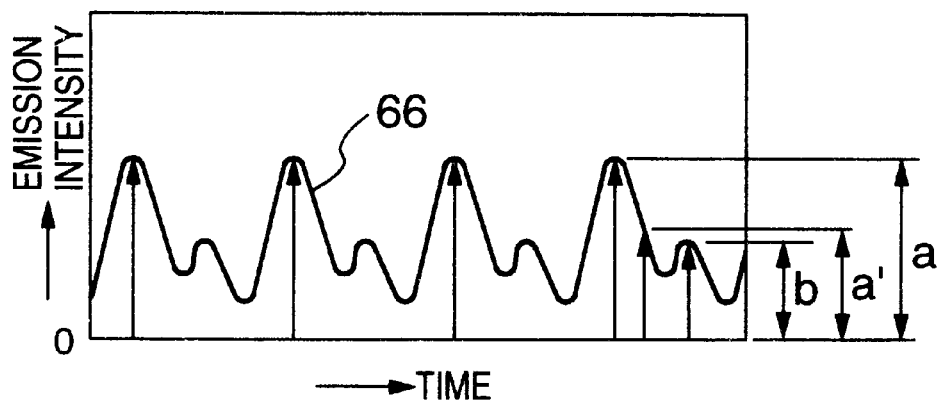
FIG. 12 is a diagram showing the emission waveform from a reaction product $CO^*$.
Figure 13:
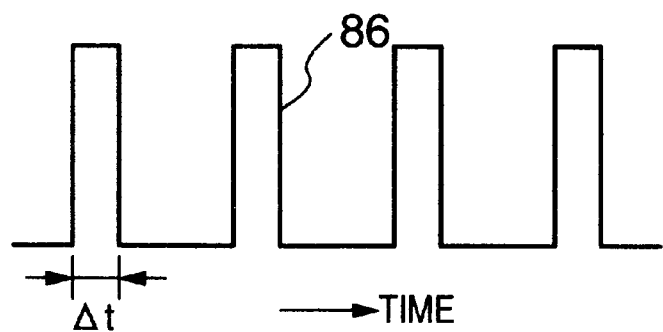
FIG. 13 is a diagram showing the waveform of a sampling signal including a pulse train (or rectangular wave function) having the width of $\Delta t$ and the frequency of 400 kHz.
Figure 14:
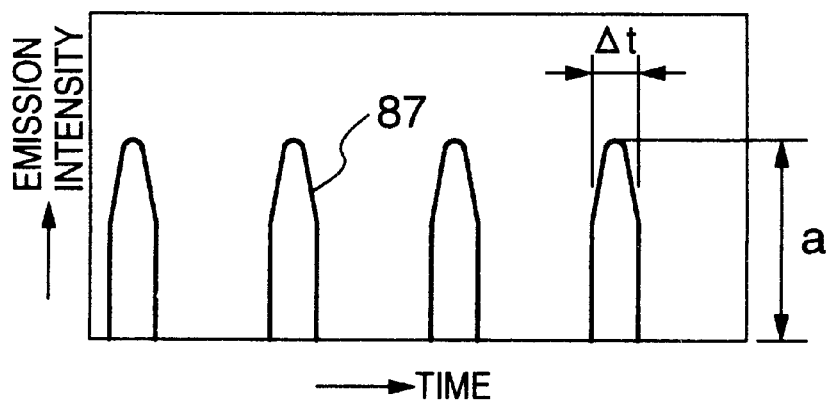
FIG. 14 is a diagram showing an emission waveform after sampling.

First, a sampling signal including a pulse train (or rectangular wave function) 86 having the width of Δt and the frequency of 400 kHz as shown in FIG. 13 is generated by a sampling signal generating circuit 81 on the basis of a high-frequency signal from the signal generator 21. A waveform 66 shown in FIG. 12 is the emission waveform from a reaction product CO* detected by the photoelectric conversion element 28 through an interference filter having a transmission center frequency of 219 nm. The sampling signal 86 is phase-shifted through a phase shifter 82 by a desired amount in accordance with the emission waveform and is thereafter sent to a multiplication circuit 83. In the multiplication circuit 83, the emission signal 66 outputted from the amplifier 29 is multiplied by the sampling signal 86 so that an emission waveform 87 in a period of time corresponding to the pulse width Δt of the sampling signal 86 is sampled and outputted, as shown in FIG. 14. In FIG. 14, a higher peak having the period of 400 kHz is caught. However, it is also possible to catch a waveform at a timing with slight attenuation from the higher peak (or an amplitude a') by adjusting the amount of phase shift or to catch a lower peak having the period of 400 kHz (or an amplitude b), as in the fourth embodiment. In any case, it is preferable that the amount of phase shift is set such that the emission waveform is sampled at a timing with which an etching reaction is reflected most strongly. Also, it is preferable that the sampling period Δt is set to a time width with which the etching reaction is reflected most strongly.

An output signal from the multiplification circuit 83 is sent to a low pass filter 84 of about 100 Hz to obtain an emission intensity signal similar to that shown in FIG. 5. This emission intensity signal is sent to an end point judging circuit 85 in which in a manner similar to that in the first embodiment, the emission intensity at a changing point or the value of first-order differentiation or second-order differentiation thereof is compared with a preset threshold to determine the end point position of etching. When the end point is detected, the output of the power amplifier 22 is stopped on the basis of a control signal.

Two systems of circuits according to the present embodiment can be provided so that as in the fourth embodiment, an emission signal from a reaction product is divided into two portions, these signals are respectively sampled at different timings and a difference between both the signals or the ratio of one thereof to the other is thereafter determined, thereby reducing the influence of unnecessary emission components which are generated due to a difference between the timings of application to the upper and lower electrodes and have a low relation with the etching reaction just above the wafer.

According to the present embodiment, with the construction in which only a frequency component synchronous with the high-frequency electric power for plasma excitation is extracted from among emission wavelength components of a reaction product, as in the first embodiment, the progressing status of etching can be seized more accurately and a change in signal at an end point becomes clear, thereby improving the precision of detection of an etching end point for a minute aperture pattern.

Similarly, since only the frequency component synchronous with the high-frequency electric power is extracted from among the emission wavelength components of the reaction product, the unsusceptibility to the influence of gentle variations in plasma emission or the influence of unnecessary frequency components is obtained, thereby improving the SN ratio of an emission intensity signal.

Also, according to the present embodiment, since the timing of sampling of an emission waveform can be adjusted arbitrarily, it becomes possible to obtain emission information in which an etching reaction is reflected more strongly, thereby improving the precision of end point detection.

Further, according to the present embodiment, since an emission waveform in a certain fixed period Δt is sampled and is thereafter passed through a low pass filter, it is possible to reduce noise components superimposed on the emission waveform, thereby improving the precision of end point detection.

Though the foregoing embodiments have been described in conjunction with the case where the frequency of the high-frequency electric power for plasma excitation is 400 kHz, the present invention is not limited to such a case and is applicable to any frequency such as 800 kHz, 1 MHz and so forth, so far it is in a frequency band in which a periodic plasma emission can be observed.

Also, though the foregoing embodiments have been described in conjunction with the case where the etching device is a parallel plate type plasma etching device, it is needless to say that as apparent from the basic principle of the present invention, the present invention is not limited to such a case and is applicable to various etching devices (for example, a microwave etching device or the like) in which an etching reaction progresses periodically in a form synchronous with plasma excitation or the supply of an energy to a semiconductor wafer.

Further, though the foregoing embodiments have been described in conjunction with the example of application of the present invention to an etching device, the end point detecting method and apparatus according to the present invention are not limited to the detection of the end point of a plasma process and are applicable to the detection of an end point in various plasma process devices such as a device in which an emission spectrum intensity changes in accordance with the progress of a plasma process. Also, the object to be processed is not limited to a semiconductor wafer and is applicable to various elements and materials such as a substrate for liquid crystal display device or the like to which a plasma process is performed in a manufacturing process thereof.

Figure 15:
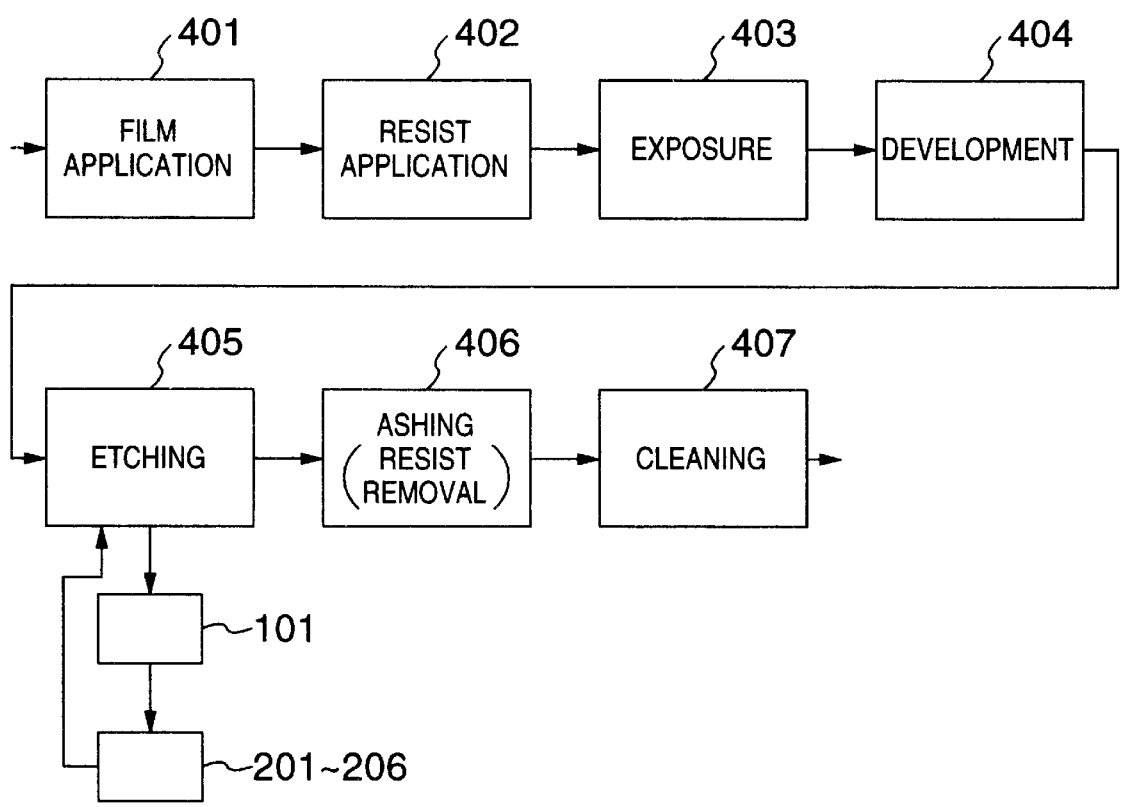
FIG. 15 is a block diagram showing a photo-lithographic process in a semiconductor manufacturing line in a seventh embodiment of the present invention.
Figure 16:
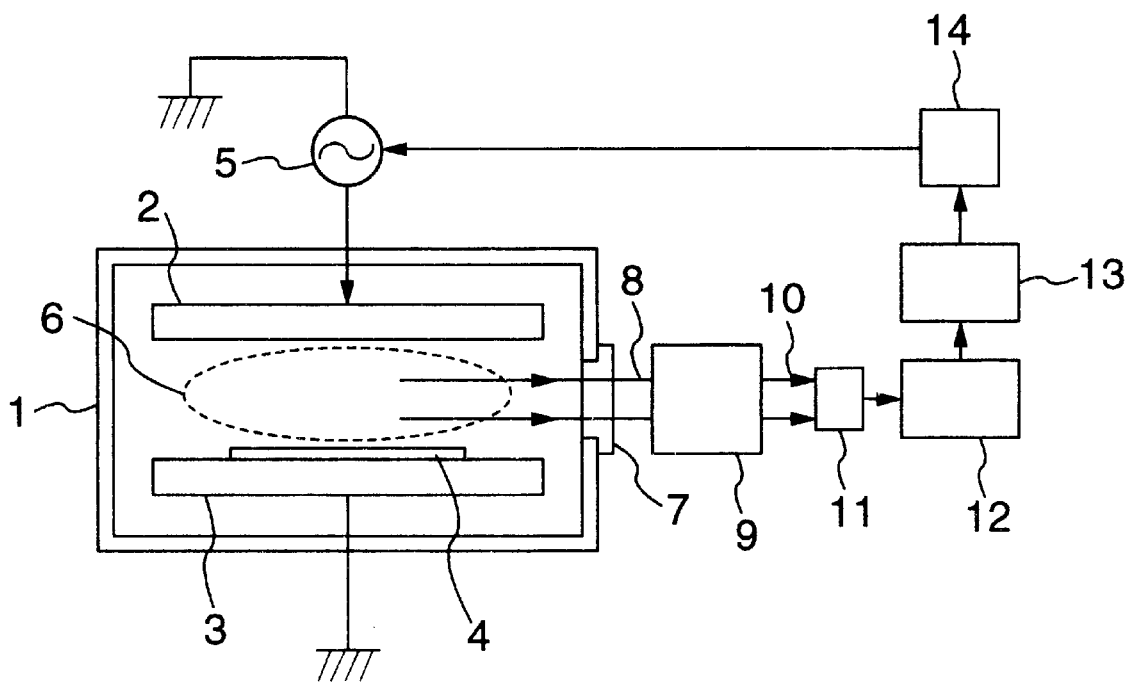
FIG. 16 is a diagram showing a plasma etching device and the conventional etching end point detecting apparatus.
Figure 17:
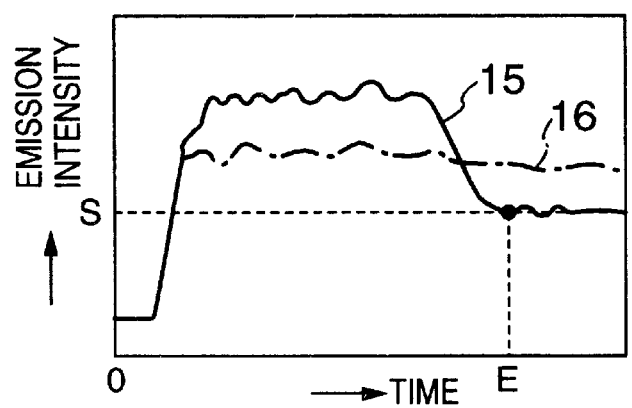
FIG. 17 is a diagram showing a temporal change in emission intensity of species in the conventional etching end point detecting apparatus.

A seventh embodiment of the present invention will be described on the basis of FIG. 15. In the present embodiment, an etching end point detecting apparatus including the emission detecting optical system 101 and the signal processing and judging system 201 to 206 based on the six embodiments mentioned above is introduced into a photolithographic process in a semiconductor manufacturing line. As shown in FIG. 15, a film such as a silicon oxide film to be processed is first formed on a semiconductor wafer by use of a film applying device 401. Next, a resist is applied by a resist applying device 402 and a desired circuit pattern on a reticle or mask is transferred by an exposing device 403. A resist portion corresponding to the transferred pattern is removed by a developing device 404 from the exposed semiconductor wafer. An etching device 405 uses the resist pattern as a mask to etch a portion of the film to be processed which has been subjected to the removal of resist. An emission spectrum from a reaction product generated during etching is detected by the emission detecting optical system 101 so that an emission intensity signal is always sent to the signal processing and judging system 201 to 206. When the end point of etching is detected, a plasma output of the etching device 405 is stopped on the basis of a control signal. The semiconductor wafer after the completion of etching is sent to an ashing device 406 by which the resist is removed. Thereafter, the semiconductor wafer is cleaned by a cleaning device 407.

In the present embodiment, with the construction in which an etching end point detecting apparatus including the emission detecting optical system 101 and the signal processing and judging system 201 to 206 based on the six embodiments mentioned above is used for an etching device under a photolithographic process, the precision of detection of an etching end point is improved so that the remainder of the etched film caused by insufficient etching or the etch of an underlayer caused by overetching is reduced. Thereby, it becomes possible to reduce defective originating in etching during the photolithographic process and it becomes possible to manufacture a semiconductor element which has a high quality.

In the etching of a minute contact hole having a pattern aperture rate equal to 1% or smaller than that, the detection of an end point is difficult under present conditions. Therefore, an etching rate and the thickness of a remaining film are measured in the course of etching and the remaining etching is completed in a time management manner. Since an extra anticipatory work is introduced in the course of etching, the throughput of an etching process is deteriorated. According to the present embodiment, however, since it becomes possible to detect an end point at a high precision always, such an anticipatory work is not required, thereby improving the producibility of an etching process and making it possible to automatize the whole of a manufacturing line.

Industrial Applicability

According to the present invention, with the construction in which only a frequency component synchronous with a high-frequency electric power for plasma excitation is extracted from among emission wavelength components of species, there is provided an effect that the progressing status of a plasma process can be seized more accurately and a change in signal at an end point becomes clear, thereby improving the precision of detection of a plasma process for a minute aperture pattern.

Similarly, since only a frequency component synchronous with a high-frequency electric power is extracted from among emission wavelength components of a reaction product, there is provided an effect that the unsusceptibility to the influence of gentle variations in plasma emission or the influence of unnecessary frequency components is obtained, thereby improving the SN ratio of an emission intensity signal.

Also, since the timing of sampling of an emission waveform can be adjusted arbitrarily, there is an effect that it becomes possible to obtain emission information in which a reaction in a plasma process is reflected more strongly, thereby improving the precision of end point detection.

Further, according to the present invention, since the detection of an etching end point at a high precision is enabled, it becomes possible to reduce defective originating in etching during a photolithographic process and it becomes possible to manufacture a semiconductor element which has a high quality.

Still further, according to the present invention, since the detection of an etching end point at a high precision is enabled, an anticipatory work for time management is not required, thereby improving the producibility of an etching process and making it possible to automatize the whole of a manufacturing line. Therefore, the present invention is very effective in industry.

We claim:

1. A plasma process end point detecting method in which when an object to be processed is subjected to a process using a plasma, the emission intensity of species producing an emission therefrom at a specified wavelength in said plasma is detected and an end point of the plasma process is detected from a change in amplitude of periodic temporal variations of said emission intensity.

2. A plasma process end point detecting method according to claim 1, wherein the frequency of the periodic temporal variations of said emission intensity is integer times as high as the frequency of a high-frequency power supply for plasma excitation.

3. A plasma process end point detecting method according to claim 1, wherein said species includes a reaction product generated by said plasma process.

4. A plasma process end point detecting method according to claim 1, wherein said species includes a reactive gas used in said plasma process or a decomposition product.

5. A plasma process end point detecting method according to claim 1, wherein said specified wavelength is approximately 219 nm.

6. A plasma process end point detecting method according to claim 1, wherein said specified wavelength is approximately 260 nm.

7. A plasma process end point detecting method according to claim 1, wherein the emission intensity of said species is detected by an imaging optical system provided with a photo detector which has an imaging relation with said plasma.

8. A plasma process end point detecting apparatus comprising emission detecting means for detecting, when an object to be processed is subjected to a process using a plasma, the emission intensity of species which produces an emission therefrom at a specified wavelength in said plasma, amplitude detecting means for detecting the amplitude of periodic temporal variations of the detected emission intensity signal, and end point judging means for detecting an end point of said process from a change in said amplitude.

9. A plasma process end point detecting apparatus according to claim 8, wherein the frequency of the periodic temporal variations of said emission intensity signal is integer times as high as the frequency of a high-frequency power supply for plasma excitation.

10. A plasma process end point detecting apparatus according to claim 8, wherein said species includes a reaction product generated by said plasma process.

11. A plasma process end point detecting apparatus according to claim 8, wherein said species includes a reactive gas used in said plasma process or a decomposition product.

12. A plasma process end point detecting apparatus according to claim 8, wherein said specified wavelength is approximately 219 nm.

13. A plasma process end point detecting apparatus according to claim 8, wherein said specified wavelength is approximately 260 nm.

14. A plasma process end point detecting apparatus according to claim 8, wherein said emission detecting means includes an imaging optical system provided with a photo detector which has an imaging relation with said plasma.

15. A semiconductor device manufacturing method in which when a semiconductor substrate is subjected to a process using a plasma, the emission intensity of species producing an emission therefrom at a specified wavelength in said plasma is detected and the plasma process is completed by detecting an end point of said plasma process from a change in amplitude of periodic temporal variations of said emission intensity.

16. A semiconductor device manufacturing apparatus in which a semiconductor substrate is subjected to a process using a plasma, the apparatus comprising emission detecting means for detecting the emission intensity of species which produces an emission therefrom at a specified wavelength in said plasma, amplitude detecting means for detecting the amplitude of periodic temporal variations of the detected emission intensity signal, and end point judging means for detecting an end point of said process from a change in said amplitude.

17. A semiconductor device manufactured by subjecting a semiconductor substrate to a process using a plasma, the semiconductor device being manufactured by detecting the emission intensity of species which produces an emission therefrom at a specified wavelength in said plasma and detecting an end point of said plasma process from a change in amplitude of periodic temporal variations of said emission intensity, thereby completing said plasma process.

* * * * *